United States Patent
Chang

(10) Patent No.: US 9,621,210 B1
(45) Date of Patent: Apr. 11, 2017

(54) COMMUNICATION DEVICE

(71) Applicant: Wistron NeWeb Corp., Hsinchu (TW)

(72) Inventor: Chung-Ping Chang, Hsinchu (TW)

(73) Assignee: Wistron NeWeb Corp., Hsinchu (TW)

( * ) Notice: Subject to any disclaimer, the term of this patent is extended or adjusted under 35 U.S.C. 154(b) by 0 days.

(21) Appl. No.: 15/254,567

(22) Filed: Sep. 1, 2016

(30) Foreign Application Priority Data

Mar. 15, 2016 (TW) .............................. 105107876 A

(51) Int. Cl.
*H04B 1/3827* (2015.01)
*H03F 3/195* (2006.01)
*H03F 3/213* (2006.01)

(52) U.S. Cl.
CPC ........... *H04B 1/3833* (2013.01); *H03F 3/195* (2013.01); *H03F 3/213* (2013.01); *H03F 2200/294* (2013.01); *H03F 2200/451* (2013.01)

(58) Field of Classification Search
CPC .. H04B 1/44; H04B 1/40; H03F 3/195; H03F 3/213
See application file for complete search history.

(56) References Cited

U.S. PATENT DOCUMENTS

| | | | |
|---|---|---|---|
| 8,380,239 B2* | 2/2013 | Liu | H04B 17/102 455/115.1 |
| 9,378,400 B2 | 6/2016 | Chang et al. | |
| 2004/0077316 A1* | 4/2004 | Xiong | H04B 1/46 455/78 |
| 2014/0213199 A1 | 7/2014 | Perten | |
| 2015/0333703 A1* | 11/2015 | Liu | H02M 3/07 330/296 |

\* cited by examiner

*Primary Examiner* — Tuan Pham
(74) *Attorney, Agent, or Firm* — Muncy, Geissler, Olds & Lowe, P.C.

(57) ABSTRACT

A communication device includes a main circuit board, a cable, and an active antenna device. The cable is configured to deliver both a DC (Direct Current) control signal and an RF (Radio Frequency) signal. The active antenna device includes a comparator, a transmission path, a reception path, and an antenna element. The comparator recovers the DC control signal. The antenna element selects the transmission path or the reception path according to the recovered DC control signal, so as to transmit or receive the RF signal.

9 Claims, 3 Drawing Sheets

COMMUNICATION DEVICE

CROSS REFERENCE TO RELATED APPLICATIONS

This Application claims priority of Taiwan Patent Application No. 105107876 filed on Mar. 15, 2016, the entirety of which is incorporated by reference herein.

BACKGROUND OF THE INVENTION

Field of the Invention

The disclosure generally relates to a communication device, and more particularly, to a communication device for reducing the total number of transmission lines.

Description of the Related Art

With recent advancements in mobile communication technology, communication devices such as portable computers, wireless network base stations, and other hybrid functional portable electronic devices have become more common. To satisfy user demand, some communication devices cover a large wireless communication area, such as 2G, 3G, and LTE (Long Term Evolution) systems using frequency bands of 700 MHz, 850 MHz, 900 MHz, 1800 MHz, 1900 MHz, 2100 MHz, 2300 MHz, and 2500 MHz, and other communication devices cover a small wireless communication area, such as Wi-Fi and Bluetooth systems using frequency bands of 2.4 GHz, 5.2 GHz, and 5.8 GHz.

Nowadays, using an active antenna device is a common solution used by antenna designers to design a communication device which is capable of transmitting and receiving RF (Radio Frequency) signals. However, an active antenna device requires an independent control signal line. If other power signal lines and RF signal lines are added, there will be too many transmission lines which cannot be disposed in the limited space of a communication device. This causes a serious design problem.

BRIEF SUMMARY OF THE INVENTION

In a preferred embodiment, the disclosure is directed to a communication device including a main circuit board, a cable, and an active antenna device. The main circuit board includes a first switch element, a first inductor, and a first capacitor. The first switch element couples a low supply voltage or a high supply voltage to a first bias node according to a first control signal. The first inductor is coupled between the first bias node and a first node. The first capacitor is coupled between an RF (Radio Frequency) transceiver port and the first node. One terminal of the cable is coupled to the first node. The active antenna device has a second node coupled to another terminal of the cable. The active antenna device includes a second inductor, a second capacitor, a voltage divider circuit, a reference voltage generator, a comparator, and an antenna element. The second inductor is coupled between the second node and a second bias node. The second capacitor is coupled between the second node and a third node. The voltage divider circuit is coupled to the second bias node. The voltage divider circuit generates a dividing voltage at a fourth node. The reference voltage generator is coupled to the second bias node. The reference voltage generator generates a reference voltage at a fifth node. The comparator compares the dividing voltage with the reference voltage, so as to generate a second control signal. The antenna element is coupled through a transmission path or a reception path to the third node according to the second control signal.

In some embodiments, the active antenna device further includes a second switch element and a third switch element. The second switch element couples the third node to the transmission path or the reception path according to the second control signal. The third switch element couples the transmission path or the reception path to the antenna element according to the second control signal.

In some embodiments, the cable is an RF cable for delivering both DC (Direct Current) control signals and RF signals.

In some embodiments, the comparator has a positive input terminal coupled to the fourth node, a negative input terminal coupled to the fifth node, and an output terminal for outputting the second control signal.

In some embodiments, the transmission path includes a short-circuited path or a power amplifier, and the reception path includes a low noise amplifier.

In some embodiments, the active antenna device further includes a fourth switch element. The fourth switch element couples the second bias node to the power amplifier or the low noise amplifier according to the second control signal.

In some embodiments, the voltage divider circuit includes a first resistor and a second resistor. The first resistor is coupled between the second bias node and the fourth node. The second resistor is coupled between the fourth node and a ground voltage.

In some embodiments, the reference voltage generator includes a third resistor and a Zener diode. The third resistor is coupled between the second bias node and the fifth node. The Zener diode is coupled between the fifth node and a ground voltage.

In some embodiments, the reference voltage is between a high logic level and a low logic level of the dividing voltage.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

In order to illustrate the purposes, features and advantages of the invention, the embodiments and figures of the invention are shown in detail as follows.

Figure 1:
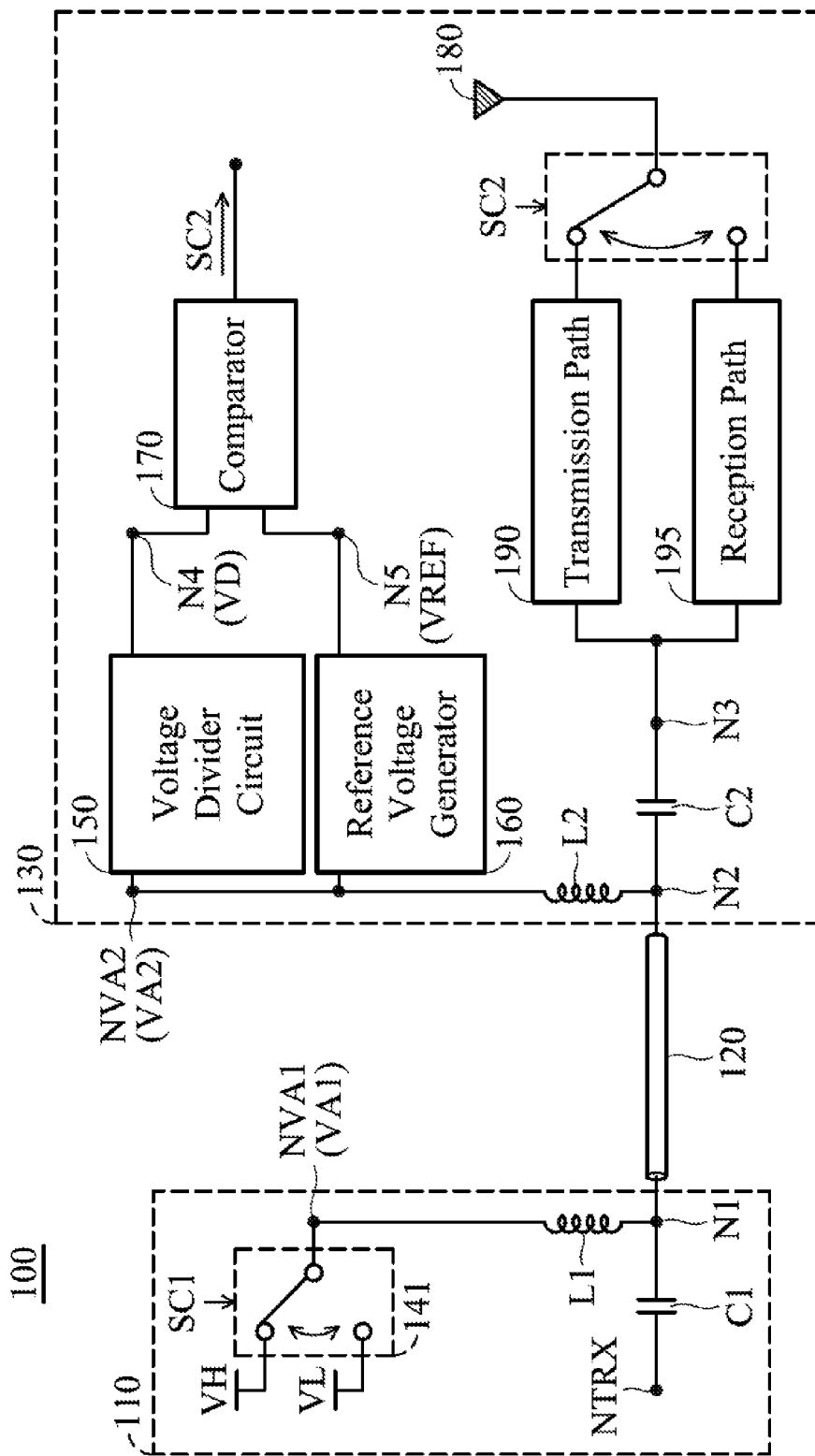
FIG. 1 is a diagram of a communication device according to an embodiment of the invention.

FIG. 1 is a diagram of a communication device 100 according to an embodiment of the invention. The communication device 100 may be a wireless access point, a router, or a notebook computer. Communication devices of these types usually include a relatively long signal transmission line. As shown in FIG. 1, the communication device 100 at least includes a main circuit board 110, a cable 120, and an active antenna device 130. Generally, the main circuit board 110 is configured to generate an RF (Radio Frequency) signal and a DC (Direct Current) control signal, or to process the received RF signal. The cable 120 is configured to deliver the RF signal and the DC control signal between the main circuit board 110 and the active antenna device 130. The active antenna device 130 operates according to the DC control signal, and selectively transmits or receives the RF signal. The active antenna device 130 serves as a solution for reducing the transmission line loss in the communication device 100. It should be noted that the communication device 100 may further include other components, such as a processor, a speaker, a touch control panel, a battery module, and a housing, although they are not displayed in FIG. 1.

The main circuit board 110 has an RF transceiver port NTRX for inputting or outputting an RF signal. The main circuit board 110 includes a first switch element 141, a first inductor L1, and a first capacitor C1. The first switch element 141 may be a SPDT (Single Port Double Throw) switch. The first switch element 141 selectively couples a low supply voltage VL or a high supply voltage VH to a first bias node NVA1 according to a first control signal SC. For example, the high supply voltage VH and the low supply voltage VL may be, but not limited to 5V and 3V. The first control signal SC1 may be generated by a processor of the main circuit board 110, and it may include a high logic level and a low logic level. For example, when the first control signal SC1 has a high logic level, the first switch element 141 may couple the high supply voltage VH to the first bias node NVA1, such that a voltage VA1 at the first bias node NVA1 is equal to the high supply voltage VH; and when the first control signal SC1 has a low logic level, the first switch element 141 may couple the low supply voltage VL to the first bias node NVA1, such that the voltage VA1 at the first bias node NVA1 is equal to the low supply voltage VL. In other words, the first switch element 141 can generate a DC control signal at the first bias node NVA1, and the waveform of the DC control signal is similar to the waveform of the first control signal SC1. It should be noted that, since the high logic level and the low logic level of the DC control signal are not 0V (e.g., 5V and 3V, respectively), the electronic components controlled by the DC control signal will keep functioning and would never be powered off. The first inductor L1 may be an RF choke inductor with an inductance greater than 2 nH. The first inductor L1 is coupled between the first bias node NVA1 and a first node N1. The first capacitor C1 may be a DC block capacitor with a capacitance greater than 2 pF. The first capacitor C1 may be coupled between the RF transceiver port NTRX and the first node N1. Generally, the first inductor L1 is configured to pass the DC control signal and block the RF signal; and conversely, the first capacitor C1 is configured to pass the RF signal and block the DC control signal. The above design can prevent the high-frequency RF signal and the low-frequency DC control signal from interfering with each other.

The cable 120 may be an RF cable. The cable 120 is coupled between the main circuit board 110 and the active antenna device 130, and is capable of delivering both the DC control signal and the RF signal at once. That is, the cable 120 is considered as a combined signal line with the functions of both the conventional control signal line and the conventional RF signal line.

The active antenna device 130 includes a second inductor L2, a second capacitor C2, a voltage divider circuit 150, a reference voltage generator 160, a comparator 170, an antenna element 180, a transmission path 190, and a reception path 195. The second inductor L2 may be an RF choke inductor with an inductance greater than 2 nH. The second inductor L2 is coupled between a second node N2 and a second bias node NVA2. The second node N2 of the active antenna device 130 is coupled through the cable 120 to the first node N1 of the main circuit board 110. The second capacitor C2 may be a DC block capacitor with a capacitance greater than 2 pF. The second capacitor C2 is coupled between the second node N2 and a third node N3. The second inductor L2 is configured to pass the DC control signal and block the RF signal. The second capacitor C2 is configured to pass the RF signal and block the DC control signal. The voltage divider circuit 150 is coupled to the second bias node NVA2, and generates a dividing voltage VD at a fourth node N4. The reference voltage generator 160 generates a reference voltage VREF at a fifth node N5. The comparator 170 compares the dividing voltage VD with the reference voltage VREF, so as to generate a second control signal SC2. The waveform of the second control signal SC2 may be similar to the waveform of the first control signal SC1, and it may include a high logic level and a low logic level. The antenna element 180 is selectively coupled through the transmission path 190 or the reception path 195 to the third node N3 according to the second control signal SC2. For example, when the second control signal SC2 has a high logic level, the antenna element 180 may be coupled through the transmission path 190 to the third node N3, so as to perform a signal transmission procedure; and when the second control signal SC2 has a low logic level, the antenna element 180 may be coupled through the reception path 195 to the third node N3, so as to perform a signal reception procedure.

In the embodiment of FIG. 1, the RF signal and the DC control signal share a single cable 120, and these signals are delivered between the main circuit board 110 and the active antenna device 130. Accordingly, the communication device 100 does not need to use an independent control signal transmission line and RF signal transmission line, and it helps to reduce the total number of transmission lines and decrease the total manufacturing cost.

Figure 2:
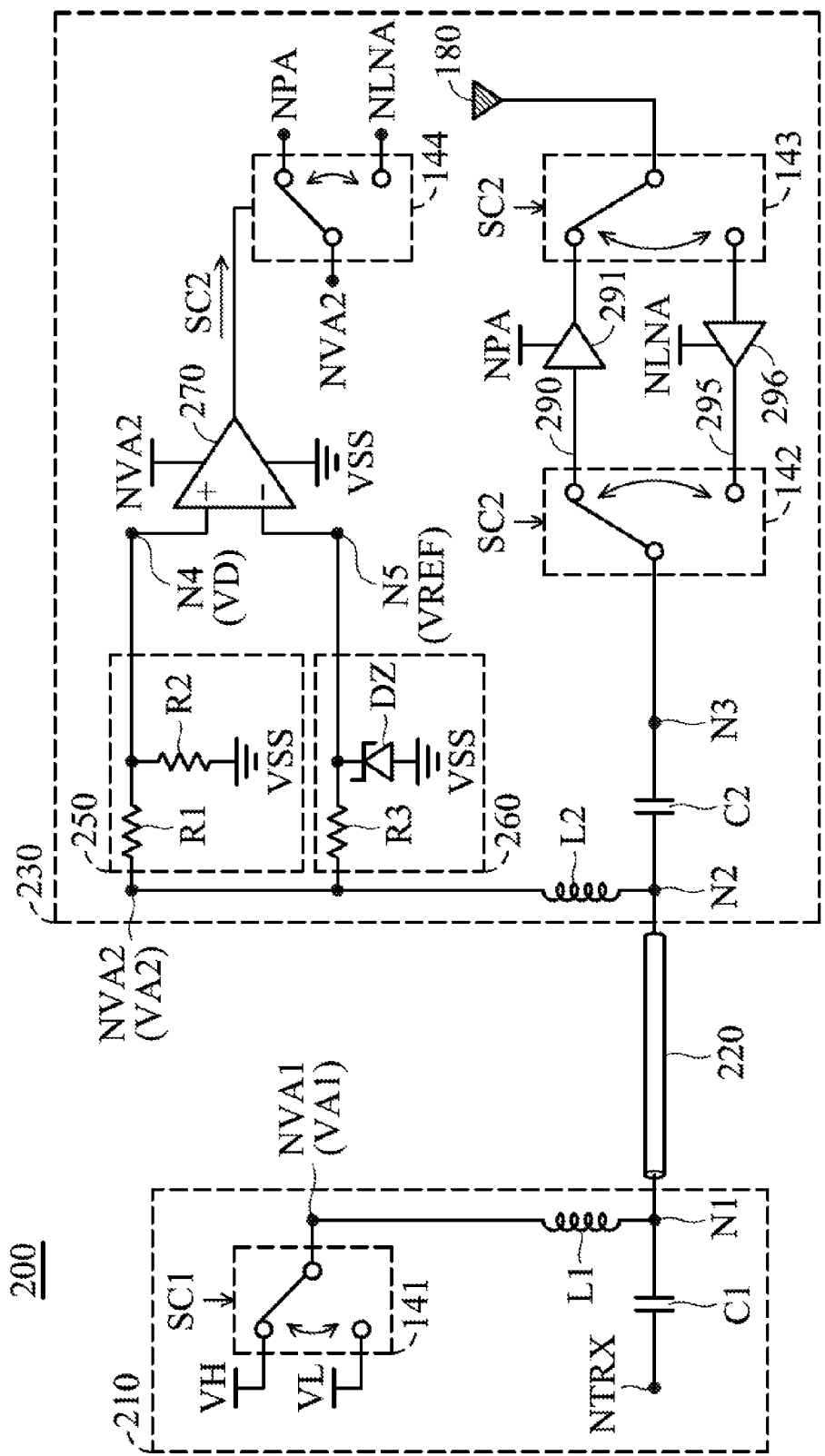
FIG. 2 is a diagram of a communication device according to an embodiment of the invention.

FIG. 2 is a diagram of a communication device 200 according to an embodiment of the invention. FIG. 2 is similar to FIG. 1. In the embodiment of FIG. 2, the communication device 200 at least includes a main circuit board 210, a cable 220, and an active antenna device 230. The structures and functions of the main circuit board 210 and the cable 220 have been described in the embodiment of FIG. 1. The following embodiments merely illustrate the difference between the FIG. 1 and FIG. 2.

In some embodiments, a voltage divider circuit 250 of the active antenna device 230 includes a first resistor R1 and a second resistor R2. The first resistor R1 is coupled between the second bias node NVA2 and the fourth node N4. The second resistor R2 is coupled between the fourth node N4 and a ground voltage VSS. At the fourth node N4, the dividing voltage VD of the voltage divider circuit 250 may be calculated according to the equations (1) and (2).

$$VA2 = VA1 - Vloss \qquad (1)$$

where "VA2" represents the voltage VA2 at the second bias node NVA2, "VA1" represents the voltage VA1 at the first bias node NVA1, and "Vloss" represents the imperfect loss of the cable 220.

$$VD = VA2 \times \frac{R2}{R1 + R2} \qquad (2)$$

where "VD" represents the dividing voltage VD, "VA2" represents the voltage VA2 at the second bias node NVA2, "R1" represents the resistance of the first resistor R1, and "R2" represents the resistance of the second resistor R2.

In an ideal case (it is assumed that Vloss is set to 0V), the voltage VA2 at the second bias node NVA2 should be equal to the voltage VA1 at the first bias node NVA1, and the dividing voltage VD should be lower than the voltage VA2 at the second bias node NVA2.

In some embodiments, a reference voltage generator 260 of the active antenna device 230 includes a third resistor R3 and a Zener diode DZ. The third resistor R3 is coupled between the second bias node NVA2 and the fifth node N5. The Zener diode DZ is coupled between the fifth node N5 and the ground voltage VSS. Specifically, the Zener diode DZ has an anode coupled to the ground voltage VSS, and a cathode coupled to the fifth node N5. The Zener diode DZ operates in a Zener breakdown region, so as to generate a stable reference voltage VREF at the fifth node N5. A comparator 270 of the active antenna device 230 has a positive input terminal coupled to the fourth node N4, a negative input terminal coupled to the fifth node N5, and an output terminal for outputting the second control signal SC2. The comparator 270 may be coupled between the second bias node NVA2 and the ground voltage VSS. The voltage VA2 at the second bias node NVA2 may be arranged as a supply voltage of the comparator 270. The dividing voltage VD may follow the voltage VA2 at the second bias node NVA2, and it may also have a high logic level and a low logic level. The reference voltage VREF is almost a constant value. As a result, when the dividing voltage VD is higher than the reference voltage VREF, the comparator 270 can output the second control signal SC2 at a high logic level; and when the dividing voltage VD is lower than the reference voltage VREF, the comparator 270 can output the second control signal SC2 at a low logic level. In order to make the second control signal SC2 recover the waveform of the first control signal SC1 from the main circuit board 110, the reference voltage VREF may be set as the inequality (3).

$$VDL < VREF < VDH \qquad (3)$$

where "VREF" represents the reference voltage VREF, "VDL" represents the low logic level of the dividing voltage VD, and "VDH" represents the high logic level of the dividing voltage VD.

For example, it is assumed in an ideal case (Vloss is set to 0). If the voltage VA1 at the first bias node NVA1 has a high logic level of 5V and a low logic level of 3V, the voltage VA2 at the second bias node NVA2 may also have a high logic level of 5V and a low logic level of 3V. It is further assumed that the resistance of the first resistor R1 is the same as the resistance of the second resistor R2. Thus, the dividing voltage VD may have a high logic level of 2.5V (i.e., 5V/2=2.5V) and a low logic level of 1.5V (i.e., 3V/2=1.5V). Under the circumstance, the reference voltage VREF should be set between 2.5V and 1.5V, and therefore the waveform of the second control signal SC2 can be consistent with the waveform of the first control signal SC1. For example, the reference voltage VREF may be set to 2V (i.e., 1.5V<2V<2.5V). The setting of the aforementioned reference voltage VREF may be achieved by selecting an appropriate Zener diode DZ. The incorporation of the voltage divider circuit 250 can reduce the difficulty to select the Zener diode DZ with a high breakdown voltage.

In some embodiments, a transmission path 290 of the active antenna device 230 includes a power amplifier 291 for amplifying an RF signal that is going to be transmitted; and a reception path 295 of the active antenna device 230 includes a low noise amplifier 296 for amplifying the received RF signal. In alternative embodiments, the power amplifier 291 is replaced with a short-circuited path. In some embodiments, the active antenna device 230 further includes a second switch element 142 and a third switch element 143.

Each of the second switch element 142 and the third switch element 143 may be an SPDT switch. The second switch element 142 selectively couples the third node N3 to the transmission path 290 or the reception path 295 according to the second control signal SC2. The third switch element 143 selectively couples the transmission path 290 or the reception path 295 to the antenna element 180 according to the second control signal SC2. For example, when the second control signal SC2 has a high logic level, the second switch element 142 may couple the third node N3 to the transmission path 290, and the third switch element 143 may couple the transmission path 290 to the antenna element 180, so as to perform a signal transmission procedure; and conversely, when the second control signal SC2 has a low logic level, the second switch element 142 may couple the third node N3 to the reception path 295, and the third switch element 143 may couple the reception path 295 to the antenna element 180, so as to perform a signal reception procedure. With such a design, the active antenna device 230 can operate according to the second control signal SC2, which is a duplicate of the first control signal SC1. The active antenna device 230 can selectively perform the procedures for either transmitting or receiving RF signals.

In some embodiments, the active antenna device 230 further includes a fourth switch element 144. The fourth switch element 144 may be an SPDT switch. The fourth switch element 144 selectively couples the second bias node NVA2 to the power amplifier 291 or the low noise amplifier 296 according to the second control signal SC2. For example, when the second control signal SC2 has a high logic level, the fourth switch element 144 may couple the second bias node NVA2 to a supply node NPA of the power amplifier 291, such that the supply voltage of the power amplifier 291 is the same as the voltage VA2 at the second bias node NVA2, and the low noise amplifier 296 is powered off, and conversely, when the second control signal SC2 has a low logic level, the fourth switch element 144 may couple the second bias node NVA2 to a supply node NLNA of the low noise amplifier 296, such that the supply voltage of the low noise amplifier 296 is the same as the voltage VA2 at the second bias node NVA2, and the power amplifier 291 is powered off. The above design can reduce the total power consumption of the power amplifier 291 and the low noise amplifier 296 in the transmission path 290 and the reception path 295.

Figure 3:
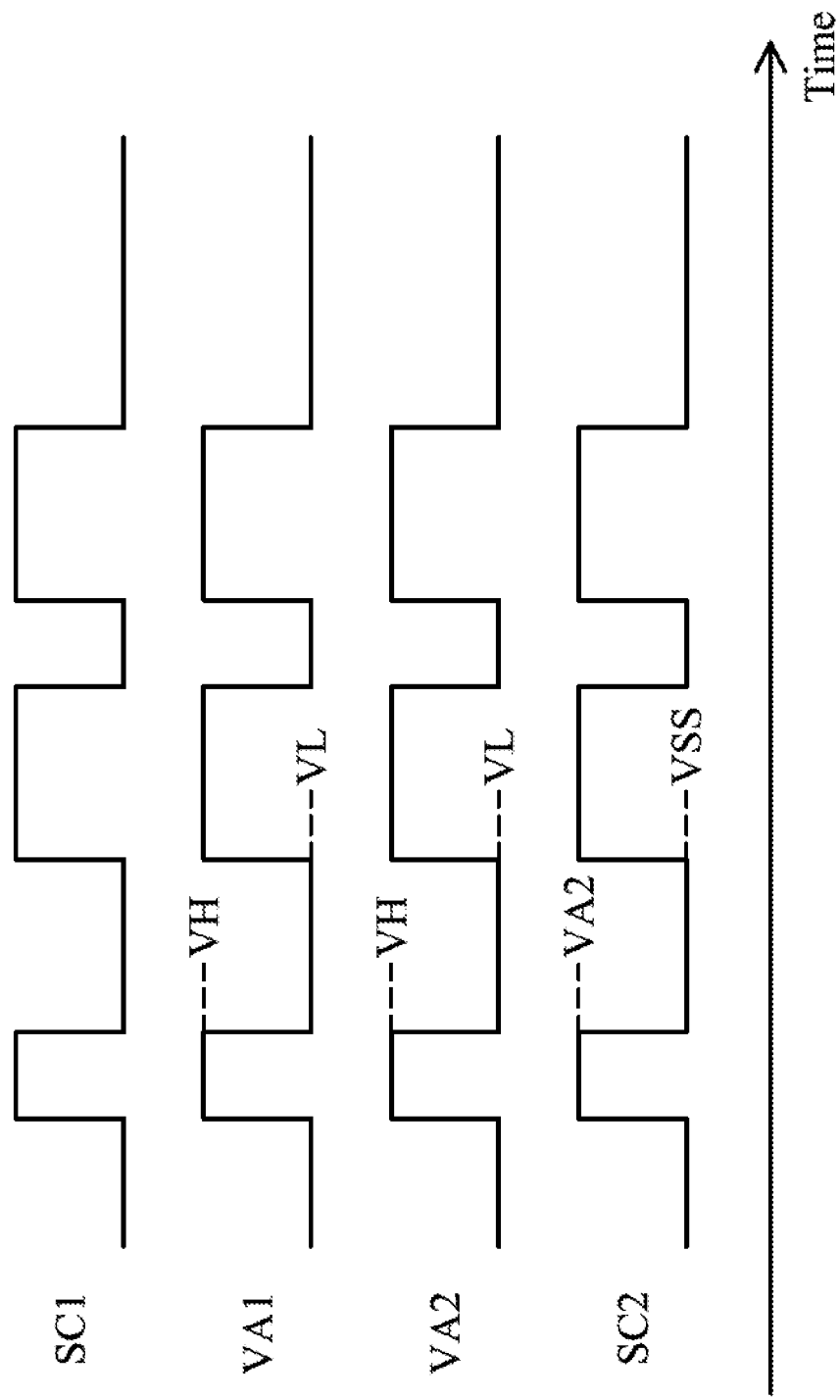
FIG. 3 is a diagram of signal waveforms of a communication device according to an embodiment of the invention.

FIG. 3 is a diagram of signal waveforms of the communication device 200 according to an embodiment of the invention. As shown in FIG. 3, the first control signal SC1, generated by the processor of the main circuit board 210, has a high logic level and a low logic level. The waveform of the voltage VA1 at the first bias node NVA1 is similar to the waveform of the first control signal SC1. The voltage VA1 has a high logic level of the high supply voltage VH and a low logic level of the low supply voltage VL. The waveform of the voltage VA2 at the second bias node NVA2 is similar to the waveform of the voltage VA1 at the first bias node NVA1. If there is no transmission line loss, the voltage VA2 will also have a high logic level of the high supply voltage VH and a low logic level of the low supply voltage VL. The waveform of the second control signal SC2 is similar to the waveform of the voltage VA2 at the second bias node NVA2. Since the second control signal SC2 is generated by the comparator 270, the second control signal SC2 has a high logic level equal to the supply voltage of the comparator 270 (i.e., the voltage VA2 at the second bias node NVA2, or the high supply voltage VH), and a low logic level equal to the ground voltage VSS. According to the diagram of waveforms in FIG. 3, the second control signal SC2 can almost recover the waveform of the first control signal SC1, and the time delay between the first control signal SC1 and the second control signal SC2 is very small. In other words, the reception and transmission operations of the active antenna device 230 are determined by the DC control signal from the main circuit board 210. Both the DC control signal and the RF signal can be delivered by the cable 220 at the same time.

The invention proposes a novel communication device, which can simplify the arrangement of transmission lines in an active antenna device, without changing the expected performance. In comparison to the conventional design, the invention involves at least the following advantages of: (1) reducing the total number of transmission lines; (2) minimizing the whole size of device; (3) decreasing the total power consumption; (4) reducing the total manufacturing cost; and (5) simplifying the whole circuit design. With such a design, the invention is suitable for application in a variety of current small-size communication devices.

Note that the above voltages, resistances, or other parameters are not limitations of the invention. A designer can fine-tune these settings or values according to different requirements. It should be understood that the communication device of the invention is not limited to the configurations of FIGS. 1-3. The invention may merely include any one or more features of any one or more embodiments of FIGS. 1-3. In other words, not all of the features displayed in the figures should be implemented in the communication device of the invention.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A communication device, comprising:
    a main circuit board, comprising:
        a first switch element, capable of coupling a low supply voltage or a high supply voltage to a first bias node according to a first control signal;
        a first inductor, coupled between the first bias node and a first node; and
        a first capacitor, coupled between an RF (Radio Frequency) transceiver port and the first node;
    a cable having a terminal coupled to the first node; and
    an active antenna device having a second node coupled to another terminal of the cable, wherein the active antenna device comprises:
        a second inductor, coupled between the second node and a second bias node;
        a second capacitor, coupled between the second node and a third node;
        a voltage divider circuit, coupled to the second bias node, and generates a dividing voltage at a fourth node;
        a reference voltage generator, coupled to the second bias node, and generates a reference voltage at a fifth node;
        a comparator, comparing the dividing voltage with the reference voltage, so as to generate a second control signal; and
        an antenna element, selectively coupled to the third node through a transmission path or a reception path according to the second control signal.

2. The communication device as claimed in claim 1, wherein the active antenna device further comprises a second switch element and a third switch element, the second switch element selectively couples the third node to the transmission path or the reception path according to the second control signal, and the third switch element selectively couples the transmission path or the reception path to the antenna element according to the second control signal.

3. The communication device as claimed in claim 1, wherein the cable is an RF cable for delivering both DC (Direct Current) control signals and RF signals.

4. The communication device as claimed in claim 1, wherein the comparator has a positive input terminal coupled to the fourth node, a negative input terminal coupled to the fifth node, and an output terminal for outputting the second control signal.

5. The communication device as claimed in claim 1, wherein the transmission path has a short-circuited path or a power amplifier, and the reception path has a low noise amplifier.

6. The communication device as claimed in claim 5, wherein the active antenna device further comprises a fourth switch element, and the fourth switch element selectively couples the second bias node to the power amplifier or the low noise amplifier according to the second control signal.

7. The communication device as claimed in claim 1, wherein the voltage divider circuit comprises a first resistor and a second resistor, the first resistor is coupled between the second bias node and the fourth node, and the second resistor is coupled between the fourth node and a ground voltage.

8. The communication device as claimed in claim 1, wherein the reference voltage generator comprises a third resistor and a Zener diode, the third resistor is coupled between the second bias node and the fifth node, and the Zener diode is coupled between the fifth node and a ground voltage.

9. The communication device as claimed in claim 1, wherein the reference voltage is between a high logic level and a low logic level of the dividing voltage.

* * * * *